United States Patent
Shih et al.

(10) Patent No.: US 7,764,761 B2
(45) Date of Patent: Jul. 27, 2010

(54) SHIFT REGISTER APPARATUS AND METHOD THEREOF

(75) Inventors: Chih-Jen Shih, Changhua County (TW); Chun-Yuan Hsu, Taipei County (TW); Che-Cheng Kuo, Taoyuan County (TW); Chun-Kuo Yu, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 71 days.

(21) Appl. No.: 12/187,384

(22) Filed: Aug. 7, 2008

(65) Prior Publication Data

US 2010/0002827 A1 Jan. 7, 2010

(30) Foreign Application Priority Data

Jul. 1, 2008 (TW) .............................. 97124750 A

(51) Int. Cl.
*G11C 19/00* (2006.01)
(52) U.S. Cl. .............................. 377/64; 377/68; 377/70; 377/77
(58) Field of Classification Search .................. 377/64, 377/68, 70, 74, 77–80
See application file for complete search history.

(56) References Cited

U.S. PATENT DOCUMENTS

| | | | |
|---|---|---|---|
| 7,106,292 B2 | 9/2006 | Moon | |
| 7,436,923 B2 * | 10/2008 | Tobita | 377/64 |
| 2006/0291610 A1 * | 12/2006 | Lo et al. | 377/64 |
| 2007/0019775 A1 | 1/2007 | Tsai et al. | |
| 2007/0195053 A1 * | 8/2007 | Tobita et al. | 345/100 |
| 2007/0274433 A1 * | 11/2007 | Tobita | 377/64 |
| 2008/0080661 A1 * | 4/2008 | Tobita | 377/78 |
| 2008/0187089 A1 * | 8/2008 | Miyayama et al. | 377/79 |
| 2008/0219401 A1 * | 9/2008 | Tobita | 377/79 |

* cited by examiner

*Primary Examiner*—Tuan Lam
(74) *Attorney, Agent, or Firm*—Jianq Chyun IP Office

(57) ABSTRACT

A shift register apparatus and a method thereof are provided. The technique manner submitted by the present invention utilizes two NMOS transistors for pulling down the voltage level of the scan signals output by the shift registers within the shift register apparatus to the low level gate voltage, wherein one of the NMOS transistors is controlled by a control unit, and the other NMOS transistor is controlled by a clock signal or the inverted clock signal provided to the shift registers. Therefore, shifting amount of the threshold voltage of those NMOS transistors can trend to be flat, and the reliability of those NMOS transistors can be promoted. In addition, since only one control unit is needed to dispose in each shift register so that the layout area of whole shift register apparatus can be reduced, and the panel with narrow frame size also can be achieved by the present invention.

8 Claims, 6 Drawing Sheets

US 7,764,761 B2

SHIFT REGISTER APPARATUS AND METHOD THEREOF

CROSS-REFERENCE TO RELATED APPLICATION

This application claims the priority benefit of Taiwan application serial no. 97124750, filed on Jul. 1, 2008. The entirety of the above-mentioned patent application is hereby incorporated by reference herein and made a part of specification.

BACKGROUND OF THE INVENTION

1. Field of the Invention

The present invention relates to a shift register apparatus and a method thereof. More particularly, the present invention relates to a shift register apparatus and a method thereof which may improve a utilization reliability of NMOS transistors used for pulling down voltage levels of output scan signals within the shift register apparatus to a low level gate voltage, and may cope with an increasing demand of narrow frame panels.

2. Description of Related Art

Recently, with booming development of the semiconductor technology, portable electronic devices and flat panel displays are widely used. Among various kinds of panel displays, the liquid crystal displays (LCDs) having the features of low operation voltage, no radiation, light-weight, small-size, etc. become popular in the market recently. Accordingly, the LCDs developed by various manufacturers trend to be miniaturization and low cost.

To reduce a fabrication cost of the LCD, under a condition that the LCD panel is fabricated based on an amorphous silicon (a-Si) process, some manufacturers have developed a technique to directly disposed shift registers within a scan driving IC that originally disposed at a scan side of the LCD panel on a glass substrate of the LCD panel. Therefore, the scan driving IC originally disposed at the scan side of the LCD panel can be omitted, so as to save the fabrication cost of the LCD.

FIG. 1 is a circuit block diagram illustrating a conventional shift register 100 directly disposed on a glass substrate of an LCD panel. FIG. 2 is an operation waveform diagram of the shift register 100 of FIG. 1. Referring to FIG. 1 and FIG. 2, first, during a first period $t_1$ within a frame period, when a control unit 101 receives a start pulse STV provided by a timing controller (not shown), or receives a scan signal G(n−1) output from a previous shift register (not shown), the control unit 101 generates two control signals $CS_1$ and $CS_2$ to turn on the NMOS transistor $T_A$ and turn off the NMOS transistor $T_B$. Therefore, charges of a high level gate voltage $V_{GH}$ can be stored in a capacitor C during the first period $t_1$.

Next, during a second period $t_2$ within the same frame period, the control unit 101 still generates the two control signals $CS_1$ and $CS_2$ to turn on the NMOS transistor $T_A$ and turn off the NMOS transistor $T_B$. However, since the capacitor C has already stored the charges of the high level gate voltage $V_{GH}$ during the first period $t_1$, the voltage level of the control signal $CS_1$ generated by the control unit 101 during the second period $t_2$ can be increased to about twice the high level gate voltage $V_{GH}$, so as to easily raise the voltage level of the scan signal Gn output from the shift register 100 to the high level gate voltage $V_{GH}$.

Next, after the second period $t_2$ of the same frame period, the control signals $CS_1$ and $CS_2$ generated by the control unit 101 are respectively stabilized to the low level gate voltage $V_{GL}$ and the high level gate voltage $V_{GH}$, and are maintain unchanged until the first period $t_1$ and the second period $t_2$ of a next frame period. Therefore, according to the above description, the NMOS transistor $T_B$ is only turned off during the first period $t_1$ and the second period $t_2$ of the frame period, and is turned on all the other time, so as to pull down the voltage level of the scan signal Gn output from the shift register 100 to the low level gate voltage $V_{GL}$.

In such case, the NMOS transistor $T_B$ may be aged quickly due to a long time turning on state thereof, and accordingly utilization reliability thereof is decreased. Moreover, a charge trapping effect of the NMOS transistor $T_B$ is deteriorate, so that a threshold voltage Vth of the NMOS transistor $T_B$ is accelerately increased due to the long time turning on state. Therefore, a capability that the NMOS transistor $T_B$ pulls down the voltage level of the scan signal Gn output from the shift register to the low level gate voltage $V_{GL}$ is decreased.

Accordingly, a pixel activated corresponding to the scan signal Gn is liable to be mistaken as a pixel activated corresponding to the scan signal G(n+1) output by a next stage shift register, so that images displayed on the LCD can be abnormal.

To resolve the aforementioned problem, number of the NMOS transistors used for pulling down the voltage level of the scan signal output from the shift register to the low level gate voltage is suggested to be increased, and each of the NMOS transistors is utilized together with a control unit, so that only one NMOS transistor pulls down the voltage level of the scan signal output from the shift register to the low level gate voltage at a same time, so as to resolve the above problem.

FIG. 3 is a circuit block diagram of a shift register 300 which may resolve the problem of the shift register 100 of FIG. 1. In which when the voltage level of the scan signal Gn output from the shift register 300 has to be pulled down to the low level gate voltage $V_{GL}$, the control units 301a and 301b may work under a separated operation mode to control only one of the NMOS transistors $T_2$ and $T_6$ to pull down the voltage level of the scan signal On output from the shift register 300 to the low level gate voltage $V_{GL}$ at the same time, so as to resolve the problem of the shift register 100.

FIG. 4 is a stress testing diagram for the NMOS transistor $T_B$ of the shift register 100 of FIG. 1 and the NMOS transistors $T_2$ and $T_6$ of the shift register 300 of FIG. 3. Referring to FIG. 4, a horizontal axis thereof represents time (hour), a vertical axis thereof represents shifting amounts of the threshold voltages (Vth) of the NMOS transistors $T_B$, $T_2$ and $T_6$ (voltage), wherein the horizontal axis and the vertical axis all apply a log scale. Moreover, a solid line 401 raised along with the time represents a shifting amount of the threshold voltage (Vth) of the NMOS transistor $T_B$ of the shift register 100, and a dot line 402 raised along with the time represents shifting amounts of the threshold voltages (Vth) of the NMOS transistors $T_2$ and $T_6$ of the shift register 300.

According to the above description of FIG. 4, it is obvious that shifting amounts of the threshold voltages (Vth) of the NMOS transistors $T_2$ and $T_6$ of the shift register 300 flatly trend to the shifting amounts of the threshold voltages (Vth) of the NMOS transistors $T_B$ of the shift register 100. Therefore, the utilization reliability of the NMOS transistors $T_2$ and $T_6$ can be improved, and the capability that the NMOS transistors $T_2$ and $T_6$ pull down the voltage level of the scan signal On output from the shift register 300 to the low level gate voltage $V_{GL}$ is increased accordingly.

Though the shift register 300 of FIG. 3 can resolve the problem of the shift register 100, the NMOS transistors $T_2$ and $T_6$ used for pulling down the voltage level of the scan signal Gn output from the shift register 300 to the low level gate voltage $V_{GL}$ have to be respectively utilized together with the control units 301a and 301b, so that an layout area of the shift register 300 is increased a lot, which is of no avail to the increasing demand of narrow frame panels.

SUMMARY OF THE INVENTION

Accordingly, to cope with increasing demand of narrow frame panels, and to improve a utilization reliability of NMOS transistors within a shift register that used for pulling down voltage levels of output scan signals thereof to a low level gate voltage, the present invention provides a shift register apparatus directly disposed on a glass substrate of an LCD panel. The shift register apparatus includes a plurality of shift registers connected in serial. Each of the shift registers includes a first transistor, a second transistor, a third transistor, an energy storage device and a control unit.

In an embodiment of the present invention, a first drain/source of the first transistor receives a first clock signal, a gate of the first transistor receives a first control signal, and a second drain/source of the first transistor is used for generating a scan signal. A first drain/source of the second transistor is electrically connected to the second drain/source of the first transistor, a gate of the second transistor receives a second clock signal, and a second drain/source of the second transistor receives the first clock signal, wherein a phase difference between the first clock signal and the second clock signal is 180 degrees.

A first drain/source of the third transistor is electrically connected to the second drain/source of the first transistor, a gate of the third transistor receives a second control signal, and a second drain/source of the third transistor receives a low level gate voltage. The energy storage device is electrically connected between the gate and the second drain/source of the first transistor. The control unit generates the first control signal and the second control signal according to the first clock signal, the second clock signal, the low level gate voltage and a start signal.

In an embodiment of the present invention, each shift register utilizes the first transistor to pull up a voltage level of the scan signal to a high level gate voltage, and separately utilizes the second transistor and the third transistor to pull down the voltage level of the scan signal to the low level gate voltage during a frame period.

In an embodiment of the present invention, the control unit includes a fourth transistor, a fifth transistor, a sixth transistor, and a seventh transistor. Wherein, a first drain/source of the fourth transistor receives the start signal, a gate of the fourth transistor receives the second clock signal, and a second drain/source of the fourth transistor is electrically connected to the gate of the first transistor for generating the first control signal. A gate of the fifth transistor is electrically connected to the second drain/source of the fourth transistor, a first drain/source of the fifth transistor receives the low level gate voltage, and a second drain/source of the fifth transistor is electrically connected to the gate of the third transistor for generating the second control signal.

A gate of the sixth transistor is electrically connected to the second drain/source of the fifth transistor, a first drain/source of the sixth transistor is electrically connected to the second drain/source of the fourth transistor, and a second drain/source of the sixth transistor receives the low level gate voltage. A gate of the seventh transistor is electrically connected to a first drain/source thereof for receiving the first clock signal, and a second drain/source of the seventh transistor is electrically connected to the second drain/source of the fifth transistor.

In an embodiment of the present invention, the LCD panel is fabricated based on an amorphous silicon (a-Si) process. Therefore, the first transistor, the second transistor, the third transistor, the fourth transistor, the fifth transistor, the sixth transistor and the seventh transistor are NMOS transistors.

According to another aspect, the present invention provides an LCD panel including the aforementioned shift register, and an LCD including the LCD panel.

According to still another aspect, the present invention provides a shift registering method for the aforementioned shift register apparatus. The shift registering method includes following steps. First, during a first period of the frame period, when the start signal and the second clock signal are simultaneously enabled, the first control signal and the second control signal generated by the control unit are respectively enabled and disabled, so as to pull down the voltage level of the scan signal to the low level gate voltage via the second transistor. Next, during a second period of the frame period, when the start signal and the second clock signal are simultaneously disabled, the first control signal and the second control signal generated by the control unit are respectively enabled and disabled, so as to pull up the voltage level of the scan signal to the high level gate voltage via the first transistor.

Next, during a third period of the frame period, when the start signal and the second clock signal are respectively disabled and enabled, the first control signal and the second control signal generated by the control unit are simultaneously disabled, so as to pull down the voltage level of the scan signal to the low level gate voltage via the second transistor. Finally, during a fourth period of the frame period, when the start signal and the second clock signal are simultaneously disabled, the first control signal and the second control signal generated by the control unit are respectively disabled and enabled, so as to pull down the voltage level of the scan signal to the low level gate voltage via the third transistor.

According to the shift register apparatus and the method thereof provided by the present invention, number of the NMOS transistors used for pulling down the level of the scan signal outputted by the shift register to the low level gate voltage is increased to two, wherein one of the NMOS transistors is controlled by a control unit, and the other NMOS transistor is controlled by a clock signal or the inverted clock signal provided to the shift registers.

Therefore, shifting amounts of the threshold voltages of the two NMOS transistors used for pulling down the level of the scan signal output from the shift register to the low level gate voltage trend to be flat, and accordingly utilization reliability of the NMOS transistors can be greatly improved. In addition, since only one control unit is needed to dispose in each shift register so that the layout area of the whole shift register apparatus can be reduced, so as to cope with an increasing demand of narrow frame panels.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The technical functions to be achieved by the present invention are mainly to improve a utilization reliability of NMOS transistors used for pulling down voltage levels of all scan signals output by the shift registers to a low level gate voltage, and to cope with an increasing demand of narrow frame panels. In the following content, technical characteristics of the present invention are described in detail for those skilled in the art.

Figure 1:
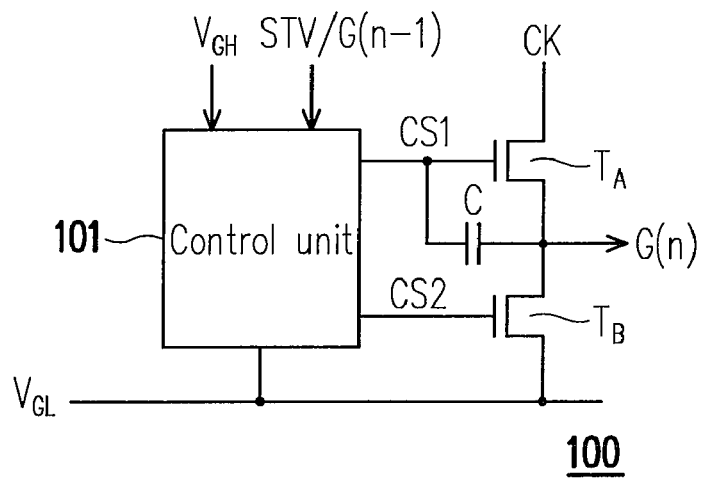
FIG. 1 is a circuit block diagram illustrating a conventional shift register 100 directly disposed on a glass substrate of an LCD panel.
Figure 2:
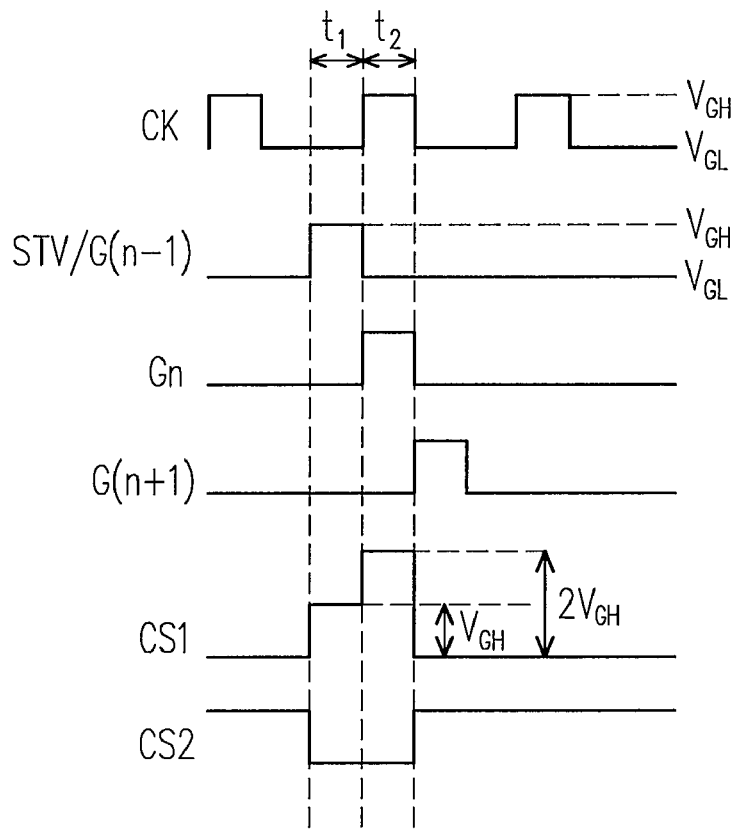
FIG. 2 is an operation waveform diagram of the shift register 100 of FIG. 1.
Figure 3:
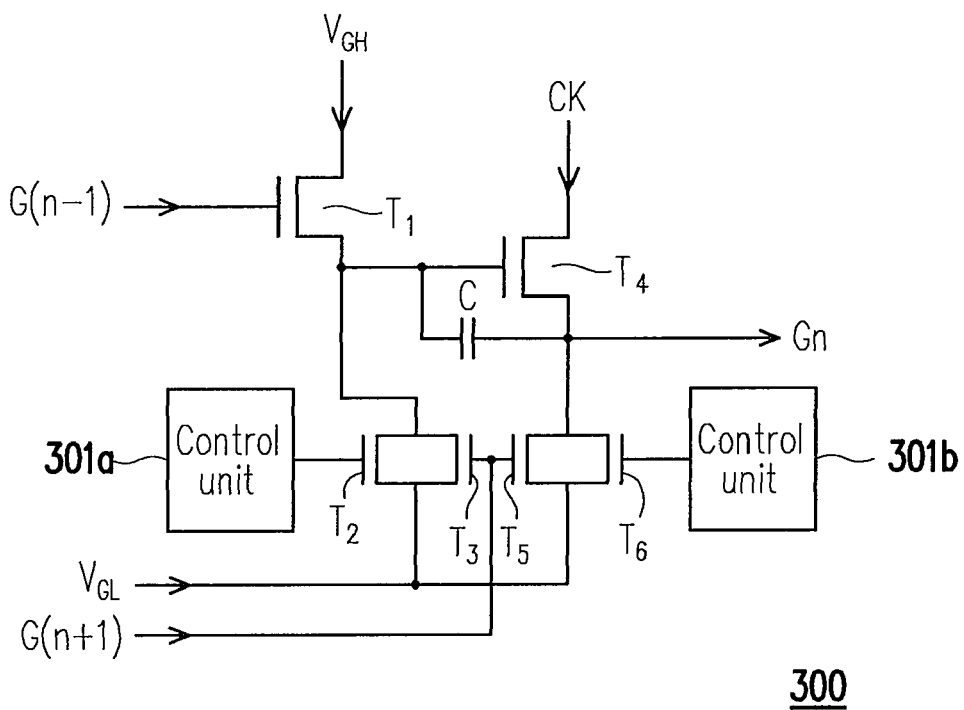
FIG. 3 is a circuit block diagram of a shift register 300 which may resolve a problem of the shift register 100 of FIG. 1.
Figure 4:
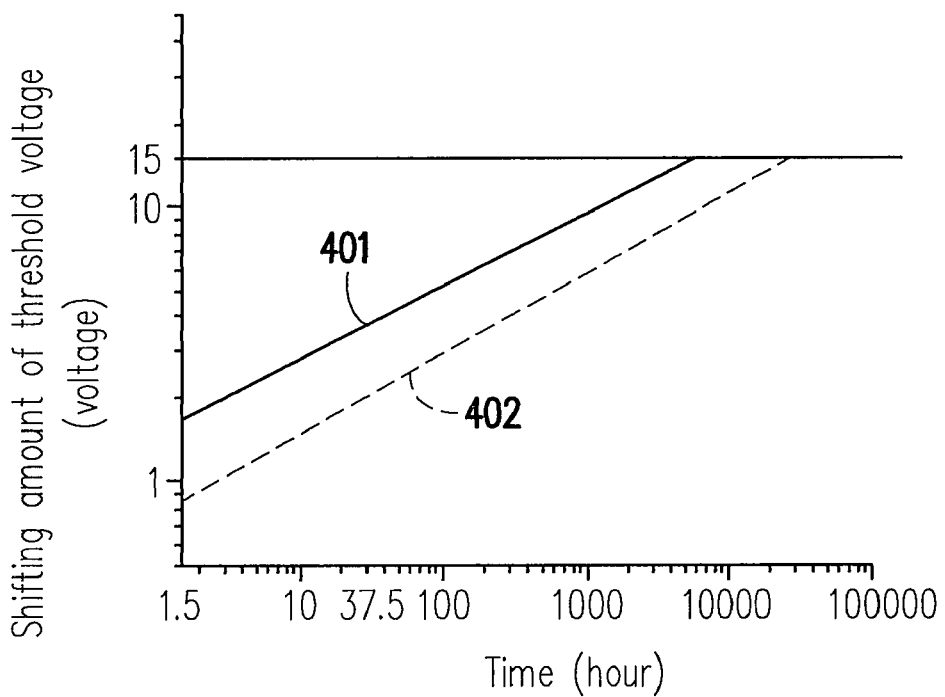
FIG. 4 is a stress testing diagram for an NMOS transistor $T_B$ of the shift register 100 of FIG. 1 and the NMOS transistors $T_2$ and $T_6$ of the shift register 300 of FIG. 3.
Figure 5:
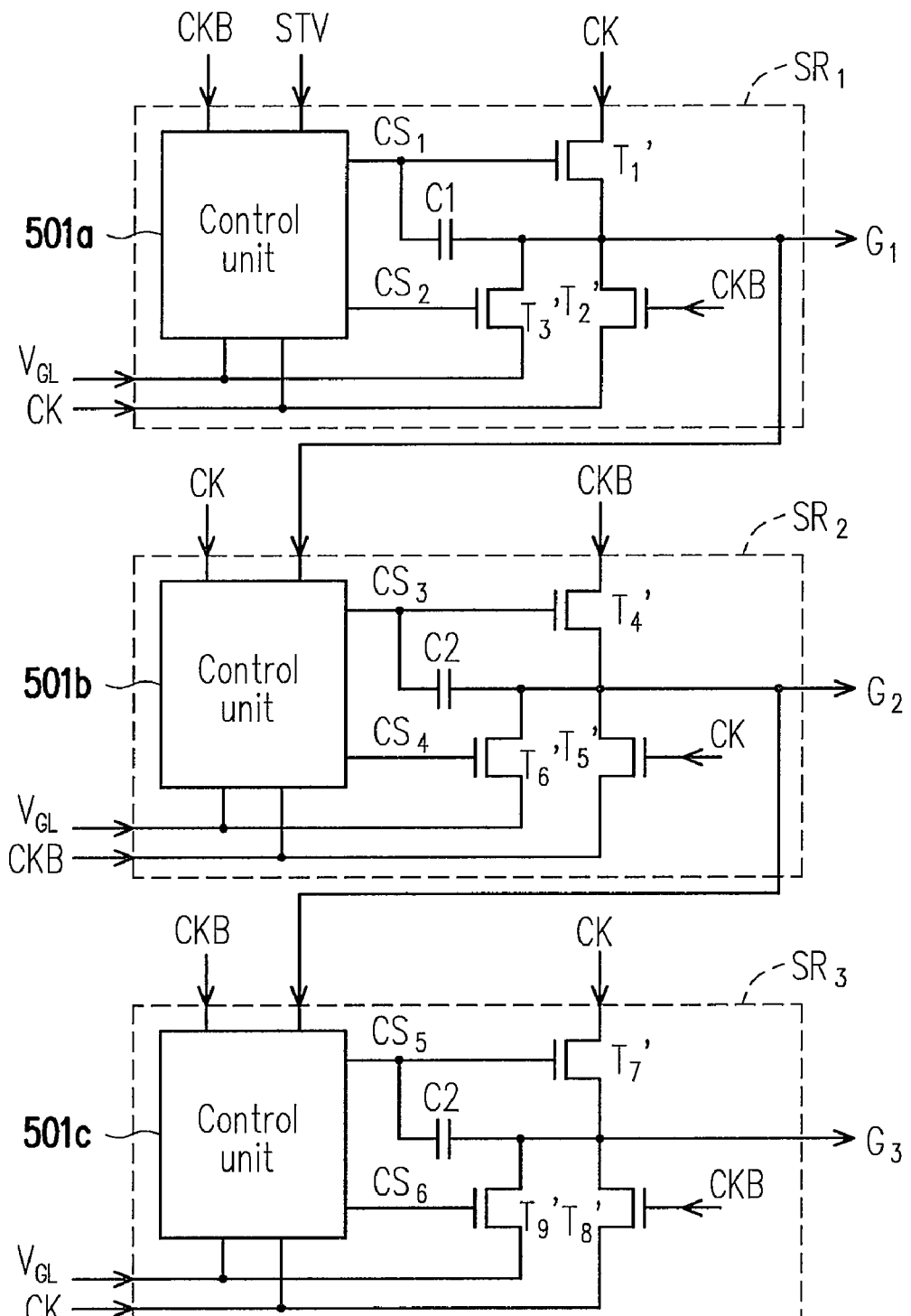
FIG. 5 is a circuit block diagram illustrating a shift register apparatus 500 according to an embodiment of the present invention.

FIG. 5 is a circuit block diagram illustrating a shift register apparatus 500 according to an embodiment of the present invention. Referring to FIG. 5, the shift register apparatus 500 of the present embodiment is directly disposed on a glass substrate of an LCD panel (not shown), and includes a plurality of shift registers (with a number thereof being equal to a number of scan lines of the LCD panel) for sequentially generating scan signals to the corresponding scan lines, so as to activate or deactivate pixels coupled to the scan lines.

Moreover, the LCD panel is fabricated based on an amorphous silicon (a-Si) process. To fully convey the spirit of the present invention, the LCD panel is assumed to have three scan lines, and accordingly, the shift register apparatus 500 has three shift registers $SR_1 \sim SR_3$, though the present invention is not limited thereof.

In the present embodiment, the shift register $SR_1$ includes a control unit 501a, transistors $T_1' \sim T_3'$ and an energy storage device $C_1$. The control unit 501a generates a control signal $CS_1$ and a control signal $CS_2$ according to a clock signal CKB, a clock signal CK, a low level gate voltage $V_{GL}$, and a start pulse STV provided by a timing controller (not shown), wherein a phase difference between the clock signal CKB and the clock signal CK is 180 degree, which can also be provided by the timing controller.

Moreover, a first drain/source of the transistor $T_1'$ receives the clock signal CK, a gate of the transistor $T_1'$ receives the control signal $CS_1$, and a second drain/source of the transistor $T_1'$ is used for generating a scan signal $G_1$. A first drain/source of the transistor $T_2'$ is electrically connected to the second drain/source of the transistor $T_1'$, a gate of the transistor $T_2'$ receives the clock signal CKB, and a second drain/source of the transistor $T_2'$ receives the clock signal CK. A first drain/source of the transistor $T_3'$ is electrically connected to the second drain/source of the transistor $T_1'$, a gate of the transistor $T_3'$ receives the control signal $CS_2$, and a second drain/source of the transistor $T_3'$ receives the low level gate voltage $V_{GL}$. The energy storage device $C_1$ is electrically connected between the gate and the second drain/source of the transistor $T_1'$, which can be implemented by a capacitor.

Moreover, the shift register $SR_1$ utilizes the transistor $T_1'$ to pull up a voltage level of the scan signal $G_1$ to a high level gate voltage $V_{GH}$, and separately utilizes the transistors $T_2'$ and $T_3'$ to pull down the voltage level of the scan signal $G_1$ to the low level gate voltage $V_{GL}$ during a frame period.

In the present embodiment, the shift register $SR_2$ includes a control unit 501b, transistors $T_4' \sim T_6'$ and an energy storage device $C_2$. Wherein, the control unit 501b generates a control signal $CS_3$ and a control signal $CS_4$ according to the clock signal CKB, the clock signal CK, the low level gate voltage $V_{GL}$, and the scan signal $G_1$ output from the shift register $SR_1$.

Moreover, a first drain/source of the transistor $T_4'$ receives the clock signal CKB, a gate of the transistor $T_4'$ receives the control signal $CS_3$, and a second drain/source of the transistor $T_4'$ is used for generating a scan signal $G_2$. A first drain/source of the transistor $T_5'$ is electrically connected to the second drain/source of the transistor $T_4'$, a gate of the transistor $T_5'$ receives the clock signal CK, and a second drain/source of the transistor $T_5'$ receives the clock signal CKB. A first drain/source of the transistor $T_6'$ is electrically connected to the second drain/source of the transistor $T_4'$, a gate of the transistor $T_6'$ receives the control signal $CS_4$, and a second drain/source of the transistor $T_6'$ receives the low level gate voltage $V_{GL}$. The energy storage device $C_2$ is electrically connected between the gate and the second drain/source of the transistor $T_4'$, which can also be implemented by a capacitor.

Moreover, the shift register $SR_2$ utilizes the transistor $T_4'$ to pull up a voltage level of the scan signal $G_2$ to the high level gate voltage $V_{GH}$, and separately utilizes the transistors $T_5'$ and $T_6'$ to pull down the voltage level of the scan signal $G_2$ to the low level gate voltage $V_{GL}$ during a frame period.

In the present embodiment, the shift register $SR_3$ includes a control unit 501c, transistors $T_7' \sim T_6'$ and an energy storage device $C_3$. Wherein, the control unit 501c generates a control signal $CS_5$ and a control signal $CS_6$ according to the clock signal CKB, the clock signal CK, the low level gate voltage $V_{GL}$, and the scan signal $G_3$ output from the shift register $SR_2$.

Moreover, a first drain/source of the transistor $T_7'$ receives the clock signal CK, a gate of the transistor $T_4'$ receives the control signal $CS_5$, and a second drain/source of the transistor $T_7'$ is used for generating a scan signal $G_3$. A first drain/source of the transistor $T_8'$ is electrically connected to the second drain/source of the transistor $T_7'$, a gate of the transistor $T_8'$ receives the clock signal CKB, and a second drain/source of the transistor $T_8'$ receives the clock signal CK. A first drain/source of the transistor $T_9'$ is electrically connected to the second drain/source of the transistor $T_7'$, a gate of the transistor $T_9'$ receives the control signal $CS_6$, and a second drain/source of the transistor $T_9'$ receives the low level gate voltage $V_{GL}$. The energy storage device $C_3$ is electrically connected between the gate and the second drain/source of the transistor $T_7'$, which can also be implemented by a capacitor.

Moreover, the shift register $SR_3$ utilizes the transistor $T_7'$ to pull up a voltage level of the scan signal $G_3$ to the high level gate voltage $V_{GH}$, and separately utilizes the transistors $T_8'$ and $T_9'$ to pull down the voltage level of the scan signal $G_3$ to the low level gate voltage $V_{GL}$ during a frame period.

Figure 6:
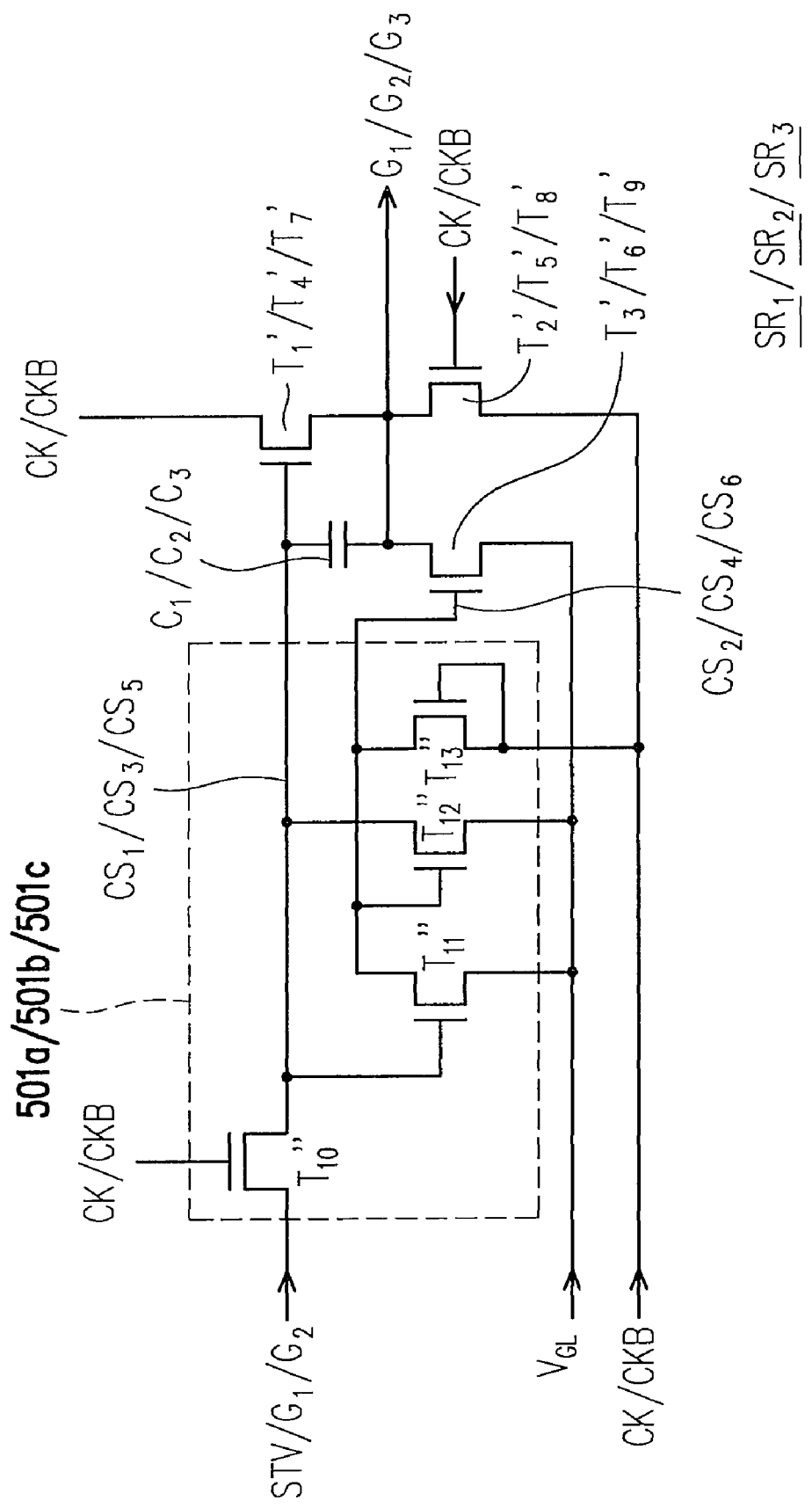
FIG. 6 is a detailed circuit diagram of one of the registers $SR_1 \sim SR_3$ within the shift register apparatus 500.

FIG. 6 is a detailed circuit diagram of one of the registers $SR_1 \sim SR_3$ within the shift register apparatus 500. Referring to FIG. 5 and FIG. 6, in the present embodiment, the control units 501a~501c are formed by transistors $T_{10}''$~$T_{13}''$. Wherein, a first drain/source of the transistor $T_{10}''$ correspondingly receives the start pulse STV/scan signal $G_1$/scan signal $G_2$, a gate of the transistor $T_{10}''$ correspondingly receives the clock signal CKB/CK, and a second drain/source of the transistor $T_{10}''$ is electrically connected to the gates of the transistors $T_1'/T_4'/T_7'$ for correspondingly generating the control signals $CS_1/CS_3/CS_5$.

A gate of the transistor $T_{11}''$ is electrically connected to the second drain/source of the transistor $T_{10}''$, a first drain/source of the transistor $T_{11}''$ receives the low level gate voltage $V_{GL}$, and a second drain/source of the transistor $T_{11}''$ is electrically connected to the gates of the transistors $T_3'/T_6'/T_9'$ for correspondingly generating the control signals $CS_2/CS_4/CS_6$. A gate of the transistor $T_{12}''$ is electrically connected to the second drain/source of the transistor $T_{11}''$, a first drain/source of the transistor $T_{12}''$ is electrically connected to the second drain/source of the transistor $T_{10}''$, and a second drain/source of the transistor $T_{12}''$ receives the low level gate voltage $V_{GL}$. A gate and a first drain/source of the transistor $T_{13}''$ are electrically connected for correspondingly receiving the clock signal CKB/CK, and a second drain/source of the transistor $T_{13}''$ is electrically connected to the second drain/source of the transistor $T_{11}''$.

It should be noted that since the LCD panel is fabricated based on the a-Si process, the aforementioned transistors $T_1'$~$T_9'$ and $T_{10}''$~$T_{13}''$ are all NMOS transistors. For describing the technical functions to be achieved by the shift register apparatus 500 of the present embodiment, an operation timing diagram of the shift register apparatus 500 is provided to fully convey the spirit of the present invention to those skilled in the art.

Figure 7:
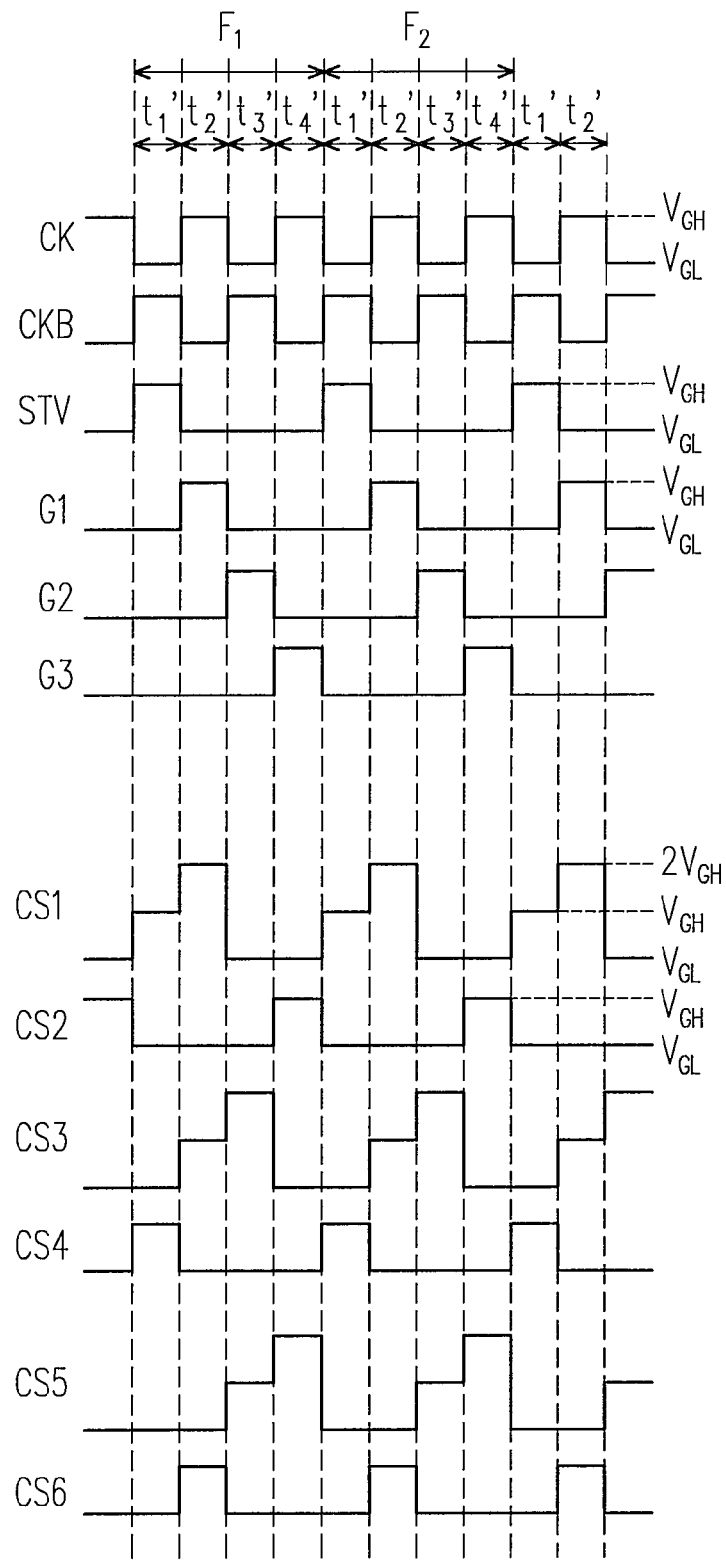
FIG. 7 is an operation timing diagram of the shift register apparatus 500 of FIG. 5.

FIG. 7 is an operation timing diagram of the shift register apparatus 500 of FIG. 5. Referring to FIG. 5 through FIG. 7, it should be noted that logic high levels of the clock signal CKB and the clock signal CK are set to the high level gate voltage $V_{GH}$ that can activate the pixels, and logic low levels of the clock signal CKB and the clock signal CK are set to the low level gate voltage $V_{GL}$ that can deactivate the pixels.

Therefore, during a first period $t_1'$ within a frame period $F_1$, since the start pulse STV and the clock signal CKB received by the shift register $SR_1$ are simultaneously enabled, the control signal $CS_1$ and the control signal $CS_2$ generated by the control unit 501a within the shift register $SR_1$ are respectively enabled and disabled. Accordingly, the transistor $T_2'$ pulls down the voltage level of the scan signal $G_1$ to the low level gate voltage $V_{GL}$, and the energy storage device $C_1$ first stores charges of the high level gate voltage $V_{GH}$ during the first period $t_1'$.

Next, during a second period $t_2'$ of the same frame period $F_1$, since the start pulse STV and the clock signal CKB received by the shift register $SR_1$ are simultaneously disabled, the control signal $CS_1$ and the control signal $CS_2$ generated by the control unit 501a within the shift register $SR_1$ are respectively enabled and disabled. However, since the energy storage device $C_1$ has already stored the charges of the high level gate voltage $V_{GH}$ during the first period $t_1'$, the voltage level of the control signal $CS_1$ generated by the control unit 501a during the second period $t_2'$ is pulled up to about twice the high level gate voltage $V_{GH}$ for being provided to the gate of the transistor $T_1'$. Accordingly, the transistor $T_1'$ pulls up the voltage level of the scan signal $G_1$ output from the shift register $SR_1$ to the high level gate voltage $V_{GH}$.

Next, during a third period $t_3'$ within the same frame period $F_1$, since the start pulse STV and the clock signal CKB received by the shift register $SR_1$ are respectively disabled and enabled, the control signal $CS_1$ and the control signal $CS_2$ generated by the control unit 501a within the shift register $SR_1$ are simultaneously disabled. Accordingly, the transistor $T_2'$ pulls down the voltage level of the scan signal $G_1$ to the low level gate voltage $V_{GL}$.

Finally, during a fourth period $t_4'$ within the same frame period $F_1$, since the start pulse STV and the clock signal CKB received by the shift register $SR_1$ are simultaneously disabled, the control signal $CS_1$ and the control signal $CS_2$ generated by the control unit 501a within the shift register $SR_1$ are respectively disabled and enabled. Accordingly, the transistor $T_3'$ pulls down the voltage level of the scan signal $G_1$ to the low level gate voltage $V_{GL}$.

According to the above description, during the frame period $F_1$, the devices in charge of pulling down the voltage level of the scan signal $G_1$ output from the shift register $SR_1$ to the low level gate voltage $V_{GL}$ are assigned to the NMOS transistors $T_2'$ and $T_3'$. Therefore, as the operation time of the shift register $SR_1$ increases, shifting amounts of the threshold voltages of the NMOS transistors $T_2'$ and $T_3'$ trend to be flat.

Moreover, since the second drain/source of the NMOS transistor $T_2'$ receives the clock signal CK, a charge trapping effect of the NMOS transistor $T_2'$ is greatly mitigated, so that the shifting amount of the threshold voltage of the NMOS transistor $T_2'$ will not be acceleratively increased along with a long time turning on state thereof, and accordingly the utilization reliability of the NMOS transistor $T_2'$ can be greatly improved.

Meanwhile, during the first period $t_1'$ within the same frame period $F_1$, since the scan signal $G_1$ and the clock signal CK received by the shift register $SR_2$ are simultaneously disabled, the control signal $CS_3$ and the control signal $CS_4$ generated by the control unit 501b within the shift register $SR_2$ are respectively disabled and enabled. Accordingly, the transistor $T_6'$ pulls down the voltage level of the scan signal $G_2$ to the low level gate voltage $V_{GL}$.

Next, during the second period $t_2'$ of the same frame period $F_1$, since the scan signal $G_1$ and the clock signal CK received by the shift register $SR_2$ are simultaneously enabled, the control signal $CS_3$ and the control signal $CS_4$ generated by the control unit 501b within the shift register $SR_2$ are respectively enabled and disabled. Accordingly, the transistor $T_5'$ pulls up the voltage level of the scan signal $G_2$ to the high level gate voltage $V_{GH}$, and the energy storage device $C_2$ first stores charges of the high level gate voltage $V_{GH}$ during the second period $t_2'$.

Next, during the third period $t_3'$ within the same frame period $F_1$, since the scan signal $G_1$ and the clock signal CK received by the shift register $SR_1$ are simultaneously disabled, the control signal $CS_3$ and the control signal $CS_3$ generated by the control unit 501b within the shift register $SR_2$ are respectively enabled and disabled. However, since the energy storage device $C_2$ has already stored the charges of the high level gate voltage $V_{GH}$ during the second period $t_2'$, the voltage level of the control signal $CS_3$ generated by the control unit 501b during the third period $t_3'$ is pulled up to about twice the high level gate voltage $V_{GH}$ for being provided to the gate of the transistor $T_4'$. Accordingly, the transistor $T_4'$ pulls up the voltage level of the scan signal $G_2$ to the high level gate voltage $V_{GH}$.

Finally, during the fourth period $t_4'$ within the same frame period $F_1$, since the scan signal $G_1$ and the clock signal CK received by the shift register $SR_2$ are respectively disabled and enabled, the control signal $CS_3$ and the control signal $CS_4$ generated by the control unit 501b within the shift register $SR_2$ are simultaneously disabled. Accordingly, the transistor $T_5'$ pulls down the voltage level of the scan signal $G_2$ to the low level gate voltage $V_{GL}$.

According to the above description, during the frame period $F_1$, the devices in charge of pulling down the voltage level of the scan signal $G_2$ output from the shift register $SR_2$ to the low level gate voltage $V_{GL}$ are assigned to the NMOS transistors $T_5'$ and $T_6'$. Therefore, as the operation time of the shift register $SR_2$ increases, shifting amounts of the threshold voltages of the NMOS transistors $T_5'$ and $T_6'$ trend to be flat.

Moreover, since the second drain/source of the NMOS transistor $T_5'$ receives the clock signal CKB, a charge trapping effect of the NMOS transistor $T_5'$ is greatly mitigated, so that the shifting amount of the threshold voltage of the NMOS transistor $T_5'$ will not be acceleratedly increased along with a long time turning on state thereof, and accordingly the utilization reliability of the NMOS transistor $T_5'$ can be greatly improved.

Meanwhile, during the first period $t_1'$ within the same frame period $F_1$, since the scan signal $G_2$ and the clock signal CKB received by the shift register $SR_3$ are respectively disabled and enabled, the control signal $CS_5$ and the control signal $CS_6$ generated by the control unit 501c within the shift register $SR_3$ are simultaneously disabled. Accordingly, the transistor $T_8'$ pulls down the voltage level of the scan signal $G_3$ to the low level gate voltage $V_{GL}$.

Next, during the second period $t_2'$ of the same frame period $F_1$, since the scan signal $G_2$ and the clock signal CKB received by the shift register $SR_3$ are simultaneously disabled, the control signal $CS_5$ and the control signal $CS_6$ generated by the control unit 501c within the shift register $SR_3$ are respectively disabled and enabled. Accordingly, the transistor $T_9'$ pulls down the voltage level of the scan signal $G_3$ to the low level gate voltage $V_{GL}$.

Next, during the third period $t_3'$ within the same frame period $F_1$, since the scan signal $G_2$ and the clock signal CKB received by the shift register $SR_3$ are simultaneously enabled, the control signal $CS_5$ and the control signal $CS_6$ generated by the control unit 501c within the shift register $SR_4$ are respectively enabled and disabled. Accordingly, the transistor $T_8'$ pulls down the voltage level of the scan signal $G_3$ to the low level gate voltage $V_{GL}$, and the energy storage device $C_3$ first stores charges of the high level gate voltage $V_{GH}$ during the third period $t_3'$.

Finally, during the fourth period $t_4'$ within the same frame period $F_1$, since the scan signal $G_2$ and the clock signal CKB received by the shift register $SR_3$ are simultaneously disabled, the control signal $CS_5$ and the control signal $CS_6$ generated by the control unit 501c within the shift register $SR_3$ are respectively enabled and disabled. However, since the energy storage device $C_3$ has already stored the charges of the high level gate voltage $V_{GH}$ during the third period $t_3'$, the voltage level of the control signal $CS_5$ generated by the control unit 501c during the fourth period $t_4'$ is pulled up to about twice the high level gate voltage $V_{GH}$ for being provided to the gate of the transistor $T_7'$. Accordingly, the transistor $T_7'$ pulls up the voltage level of the scan signal $G_3$ to the high level gate voltage $V_{GH}$.

According to the above description, during the frame period $F_1$, the devices in charge of pulling down the voltage level of the scan signal $G_3$ output from the shift register $SR_3$ to the low level gate voltage $V_{GL}$ are assigned to the NMOS transistors $T_8'$ and $T_9'$. Therefore, as the operation time of the shift register $SR_3$ increases, shifting amounts of the threshold voltages of the NMOS transistors $T_8'$ and $T_9'$ trend to be flat.

Moreover, since the second drain/source of the NMOS transistor $T_8'$ receives the clock signal CK, a charge trapping effect of the NMOS transistor $T_8'$ is greatly mitigated, so that the shifting amount of the threshold voltage of the NMOS transistor $T_8'$ will not be acceleratedly increased along with a long time turning on state thereof, and accordingly the utilization reliability of the NMOS transistor $T_8'$ can be greatly improved.

Besides, since the transistors $T_{13}''$ within the control units 501a~501c is diode connected, so that the voltage levels of the control signals $CS_2$, $CS_4$ and $CS_6$ are lower than the voltage level of the high level gate voltage $V_{GH}$, an therefore lifespan of the NMOS transistors $T_3'$, $T_6'$ and $T_9'$ can be prolonged.

Moreover, it should be noted that according to the spirit of the present invention, the second drains/sources of the NMOS transistors $T_2'$, $T_5'$ and $T_8'$ are not limited to just receive the clock signal CKB/CK. Namely, the second drains/sources of the NMOS transistors $T_2'$, $T_5'$ and $T_8'$ can also receive the low level gate voltage $V_{GL}$, while the shift register apparatus 550 can still achieve the same technical function.

Figure 8:
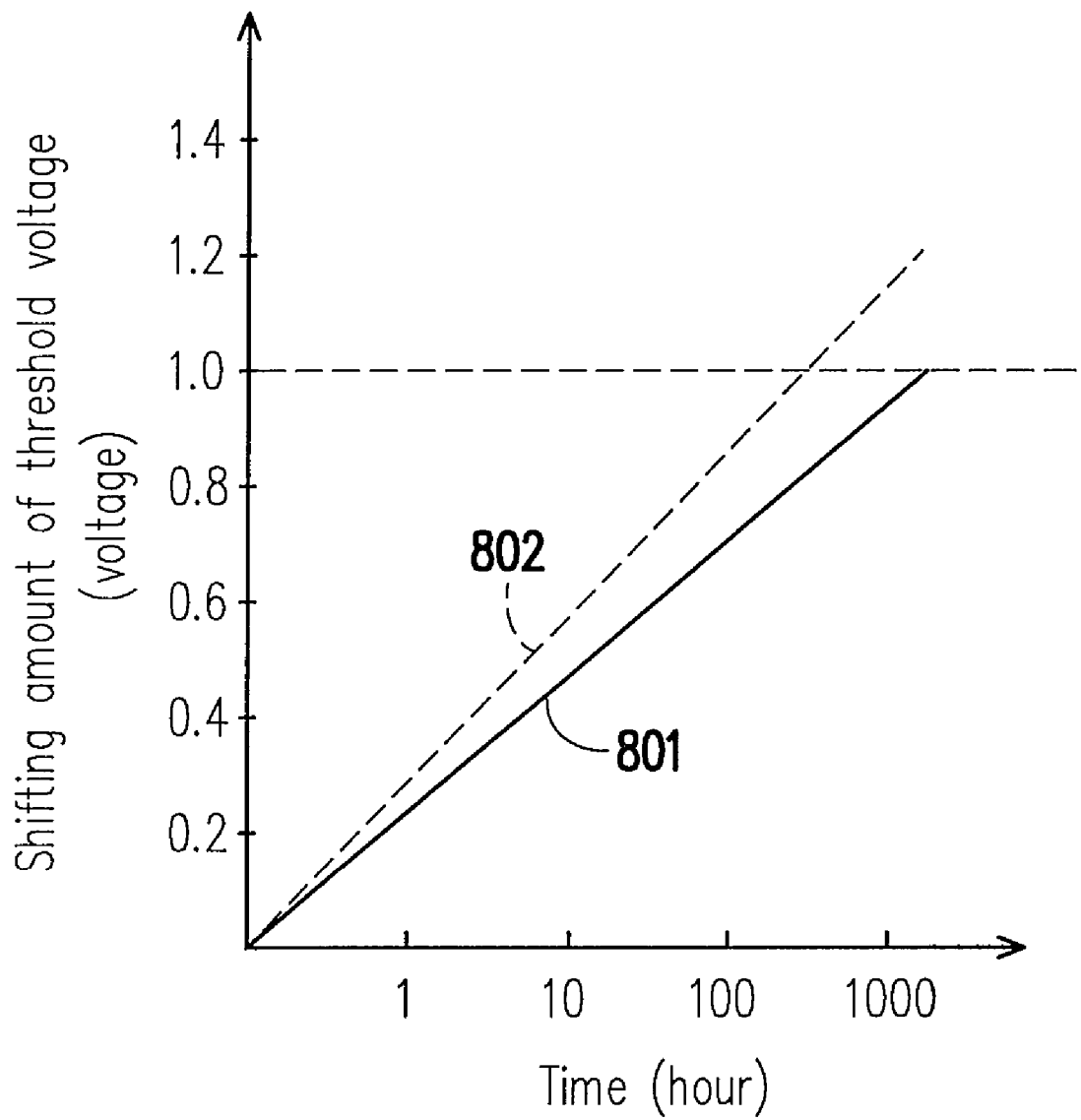
FIG. 8 is a stress testing diagram for the NMOS transistors $T_2'$, $T_5'$ and $T_8'$ of the shift registers $SR_1 \sim SR_4$ of FIG. 6 when the second drains/sources thereof individually receiving the clock signal CKB/CK and the low level gate voltage $V_{GL}$.

FIG. 8 is a stress testing diagram for the NMOS transistors $T_2'$, $T_5'$ and $T_8'$ of the shift registers $SR_1$~$SR_4$ of FIG. 6 when the second drains/sources thereof individually receiving the clock signal CKB/CK and the low level gate voltage $V_{GL}$. Referring to FIG. 8, a horizontal axis of the stress testing diagram represents time (hour), and a vertical axis thereof represents shifting amounts of the threshold voltages Vth of the NMOS transistors $T_2'$, $T_5'$ and $T_8'$. Wherein, a solid line 801 raised along with the time represents shifting amounts of the threshold voltages (Vth) measured under a condition that the second drains/sources of the NMOS transistors $T_2'$, $T_5'$ and $T_8'$ receive the clock signal CKB/CK, and a dot line 802 raised along with the time represents shifting amounts of the threshold voltages (Vth) measured under a condition that the second drains/sources of the NMOS transistors $T_2'$, $T_5'$ and $T_8'$ receive the low level gate voltage $V_{GL}$.

According to the above description of FIG. 8, it is obvious that the shifting amount of the threshold voltage (Vth) measured under the condition that the second drains/sources of the NMOS transistors $T_2'$, $T_5'$ and $T_8'$ receive the clock signal CKB/CK is less than the shifting amount of the threshold voltage (Vth) measured under the condition that the second drains/sources of the NMOS transistors $T_2'$, $T_5'$ and $T_8'$ receive the low level gate voltage $V_{GL}$.

Therefore, compared the shift register of the present invention to the shift register of the related art, the utilization reliability and lifespan of the shift register of the present invention is better and longer than that of the shift register of the related art. Moreover, since only one control unit is required within the shift register, a whole layout area of the shift register apparatus of the present invention is reduced, so as to cope with an increasing demand of narrow frame panels. Accordingly, if the shift register apparatus is directly disposed on the glass substrate of the LCD panel, the LCD panel and the LCD thereof are then considered to be within the scope of the present invention.

Besides the shift register apparatus of the aforementioned embodiment, the present invention further provides a shift registering method, and detail description of the shift registering method is included within the description of the shift register apparatus of the aforementioned embodiment. Therefore, those skilled in the art can deduce the shift registering method with reference of the aforementioned description, so that detailed description thereof will not be repeated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shift register apparatus, disposed on a glass substrate of an LCD panel, the shift register apparatus comprising:
    a plurality of shift registers, connected in serial, and each of the shift registers comprising:
        a first transistor, having a first drain/source receiving a first clock signal, a gate receiving a first control signal, and a second drain/source generating a scan signal;
        a second transistor, having a first drain/source electrically connected to the second drain/source of the first transistor, a gate receiving a second clock signal, and a second drain/source receiving the first clock signal, wherein a phase difference between the first clock signal and the second clock signal is 180 degrees;
        a third transistor, having a first drain/source electrically connected to the second drain/source of the first transistor, a gate receiving a second control signal, and a second drain/source receiving a low level gate voltage;
        an energy storage device, having a first terminal electrically connected to the gate of the first transistor and a second terminal electrically connected to the second drain/source of the first transistor, the first drain/source of the second transistor and the first drain/source of the third transistor; and
        a control unit, for generating the first control signal and the second control signal according to the first clock signal, the second clock signal, the low level gate voltage and a start signal,
    wherein, each of the shift registers utilizes the first transistor to pull up a voltage level of the scan signal to a high level gate voltage, and separately utilizes the second transistor and the third transistor to pull down the voltage level of the scan signal to the low level gate voltage during a frame period.

2. The shift register apparatus as claimed in claim 1, wherein the control unit comprises:
    a fourth transistor, having a first drain/source receiving the start signal, a gate receiving the second clock signal, and a second drain/source electrically connected to the gate of the first transistor for generating the first control signal;
    a fifth transistor, having a gate electrically connected to the second drain/source of the fourth transistor, a first drain/source receiving the low level gate voltage, and a second drain/source electrically connected to the gate of the third transistor for generating the second control signal;
    a sixth transistor, having a gate electrically connected to the second drain/source of the fifth transistor, a first drain/source electrically connected to the second drain/source of the fourth transistor, and a second drain/source receiving the low level gate voltage; and
    a seventh transistor, having a gate and a first drain/source electrically connected together for receiving the first clock signal, and a second drain/source electrically connected to the second drain/source of the fifth transistor.

3. The shift register apparatus as claimed in claim 2, wherein the LCD panel is fabricated based on an amorphous silicon process.

4. The shift register apparatus as claimed in claim 3, wherein the first transistor, the second transistor, the third transistor, the fourth transistor, the fifth transistor, the sixth transistor and the seventh transistor are NMOS transistors.

5. The shift register apparatus as claimed in claim 1, wherein the energy storage device comprises a capacitor.

6. An LCD panel having the shift register apparatus as claimed in claim 1.

7. An LCD having the LCD panel as claimed in claim 6.

8. A shift registering method, for the shift register apparatus as claimed in claim 2, the shift registering method comprising:
    during a first period of the frame period, when the start signal and the second clock signal are simultaneously enabled, individually enabling and disabling the first control signal and the second control signal generated by the control unit for utilizing the second transistor to pull down the voltage level of the scan signal to the low level gate voltage;
    during a second period of the frame period, when the start signal and the second clock signal are simultaneously disabled, individually enabling and disabling the first control signal and the second control signal generated by the control unit for utilizing the first transistor to pull up the voltage level of the scan signal to the high level gate voltage;
    during a third period of the frame period, when the start signal and the second clock signal are respectively disabled and enabled, simultaneously disabling the first control signal and the second control signal generated by the control unit for utilizing the second transistor to pull down the voltage level of the scan signal to the low level gate voltage; and
    during a fourth period of the frame period, when the start signal and the second clock signal are simultaneously disabled, individually disabling and enabling the first control signal and the second control signal generated by the control unit for utilizing the third transistor to pull down the voltage level of the scan signal to the low level gate voltage.

* * * * *